United States Patent
Rao et al.

(10) Patent No.: US 7,183,159 B2
(45) Date of Patent: Feb. 27, 2007

(54) METHOD OF FORMING AN INTEGRATED CIRCUIT HAVING NANOCLUSTER DEVICES AND NON-NANOCLUSTER DEVICES

(75) Inventors: Rajesh A. Rao, Austin, TX (US); Robert F. Steimle, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 119 days.

(21) Appl. No.: 11/035,913

(22) Filed: Jan. 14, 2005

(65) Prior Publication Data

US 2006/0160311 A1    Jul. 20, 2006

(51) Int. Cl.
*H01L 21/336* (2006.01)

(52) U.S. Cl. ............ 438/258; 438/962; 257/314; 257/E27.011; 977/774; 977/943

(58) Field of Classification Search ........ 977/773–777, 977/940, 943; 438/258, 962, 275, 279; 257/288, 257/314–317
See application file for complete search history.

(56) References Cited

U.S. PATENT DOCUMENTS

| 6,297,095 | B1 | 10/2001 | Muralidhar et al. | |
|---|---|---|---|---|
| 6,320,784 | B1* | 11/2001 | Muralidhar et al. | 365/151 |
| 6,444,545 | B1 | 9/2002 | Sadd et al. | |
| 7,091,089 | B2* | 8/2006 | Steimle | 438/258 |
| 7,091,130 | B1* | 8/2006 | Rao et al. | 438/720 |
| 2002/0063284 | A1* | 5/2002 | Aono et al. | 257/344 |
| 2002/0137281 | A1* | 9/2002 | Watanabe et al. | 438/253 |
| 2004/0212019 | A1* | 10/2004 | Shinohara et al. | 257/368 |
| 2006/0017114 | A1* | 1/2006 | Chen et al. | 257/371 |
| 2006/0105522 | A1* | 5/2006 | Steimle et al. | 438/257 |
| 2006/0108628 | A1* | 5/2006 | Hung et al. | 257/315 |

OTHER PUBLICATIONS

Cavins, Craig et al.; "A Nitride-Oxide Blocking Layer For Scaled SONOS Non-Volatile Memory"; Motorola, Inc.; Jan. 11, 2002; 5 pgs.
Cavins, Craig et al.; "Integrated Stacked Gate Oxide and Interpoly Oxide"; Motorola Technical Developments, Nov. 1996; pp. 93-94.
Related Application 10/876,805 filed Jun. 25, 2004.
Related Application 10/663,621 filed Sep. 16, 2003.

* cited by examiner

*Primary Examiner*—B. William Baumeister
*Assistant Examiner*—Matthew W. Such
(74) *Attorney, Agent, or Firm*—Robert L. King; Susan C. Hill

(57) ABSTRACT

An integrated circuit is formed by identifying multiple regions, each having transistors that have a gate oxide thickness that differs between the multiple regions. One of the regions includes transistors having a nanocluster layer and another of the regions includes transistors with a thin gate oxide used for logic functions. Formation of the gate oxides of the transistors is sequenced based upon the gate oxide thickness and function of the transistors. Thin gate oxides for at least one region of transistors are formed after the formation of gate oxides for the region including the transistors having the nanocluster layer.

19 Claims, 16 Drawing Sheets

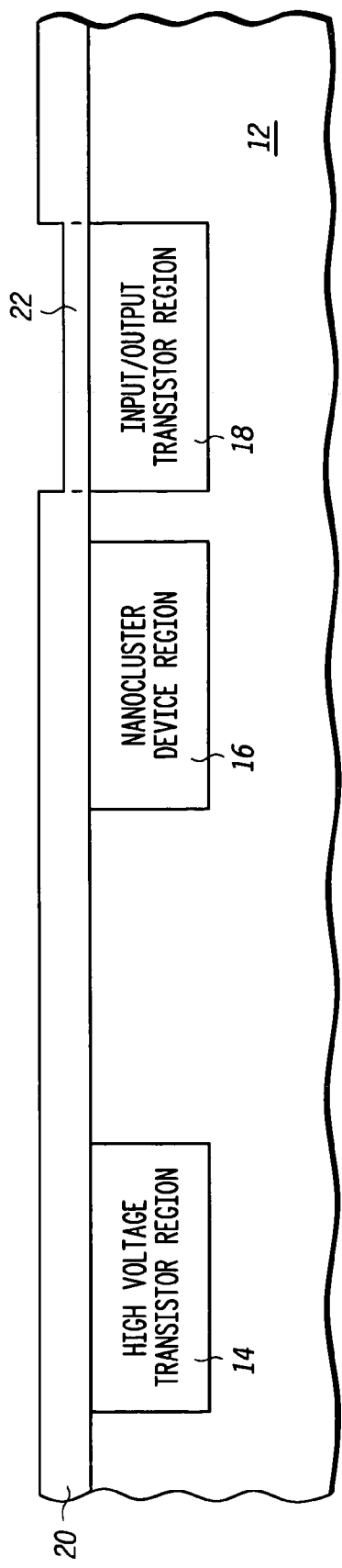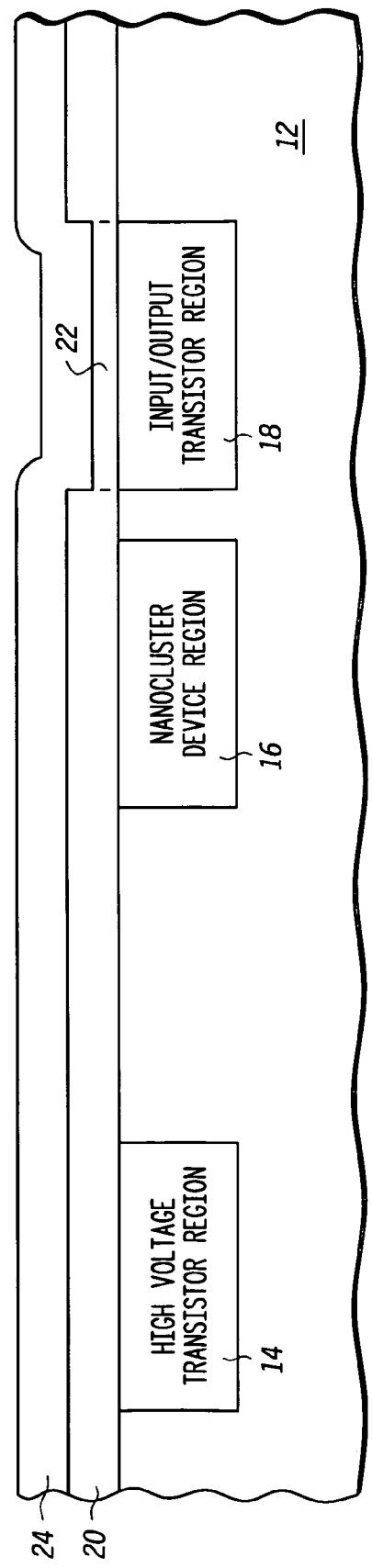

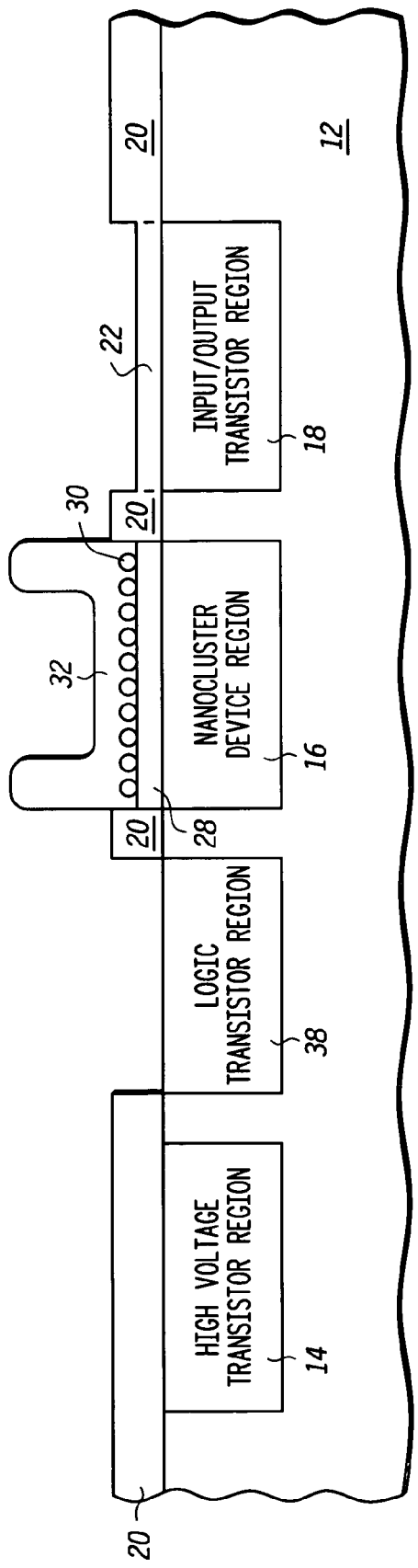
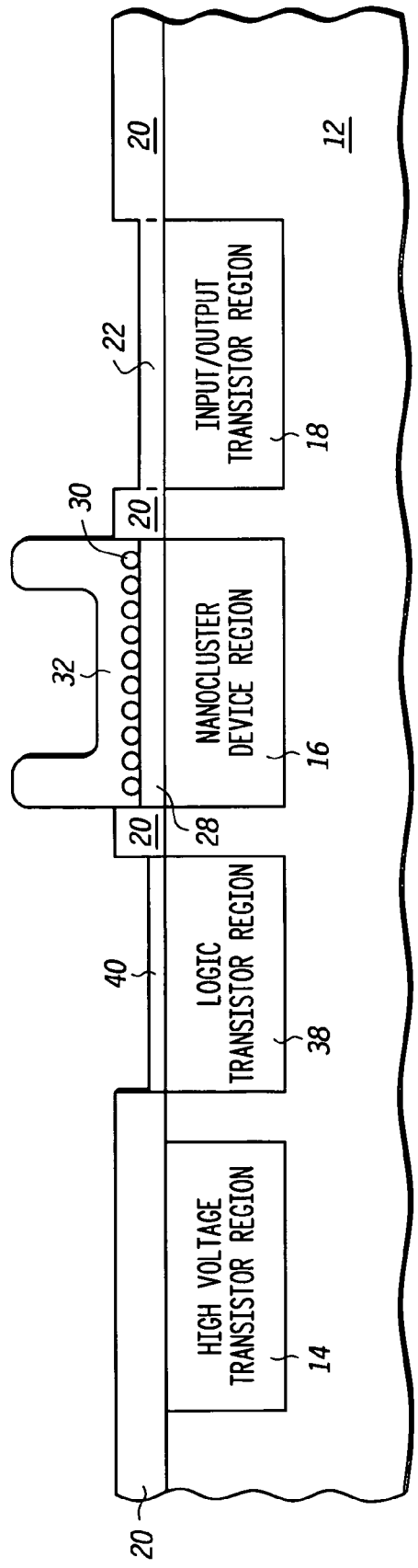
FIG. 7
FIG. 8

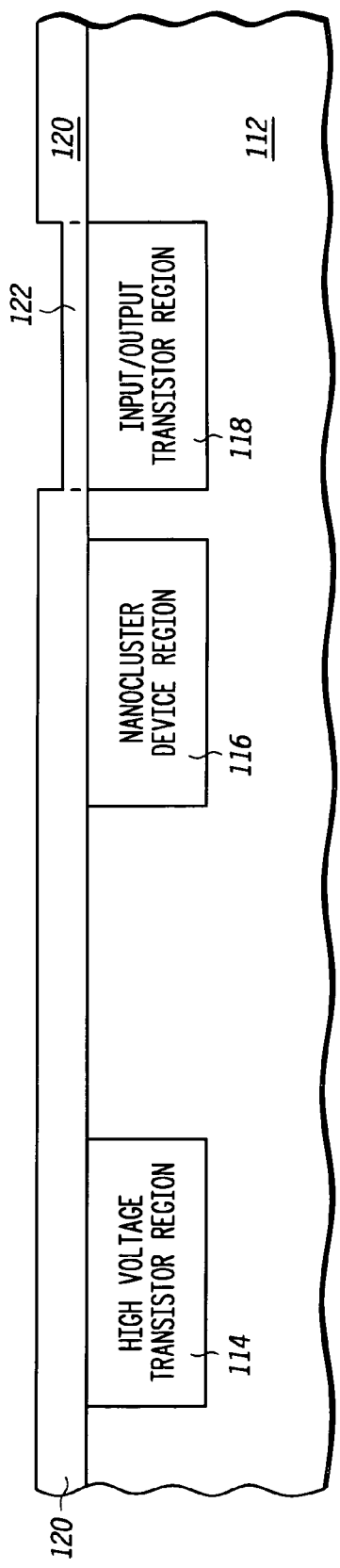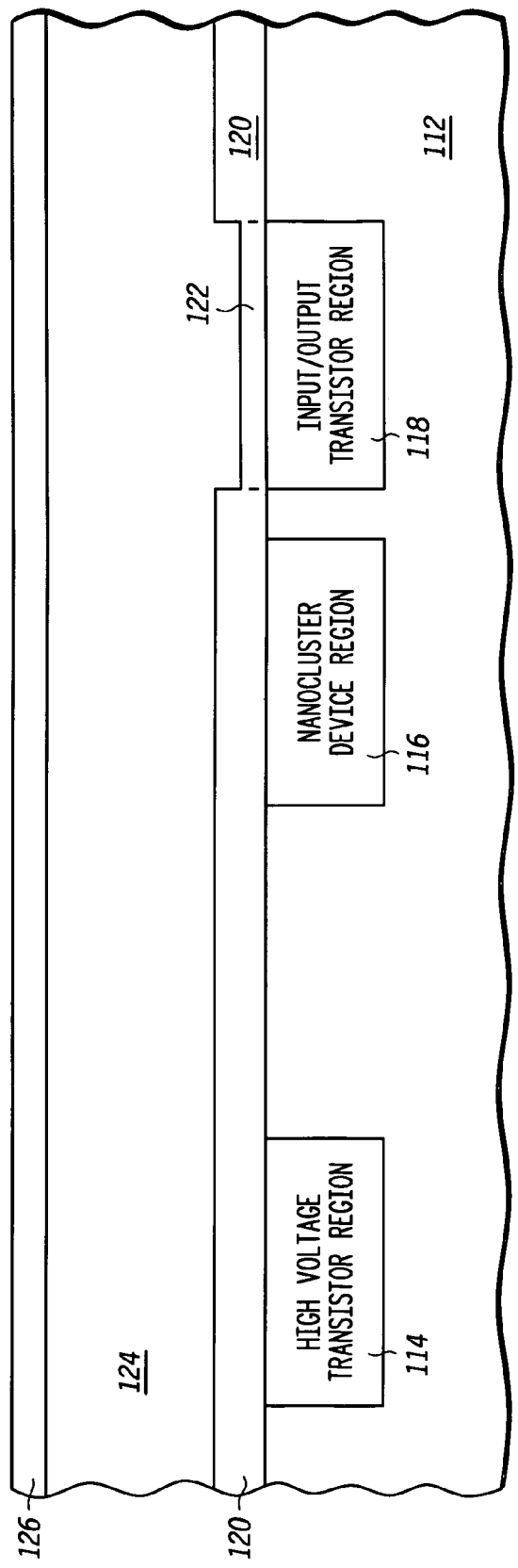

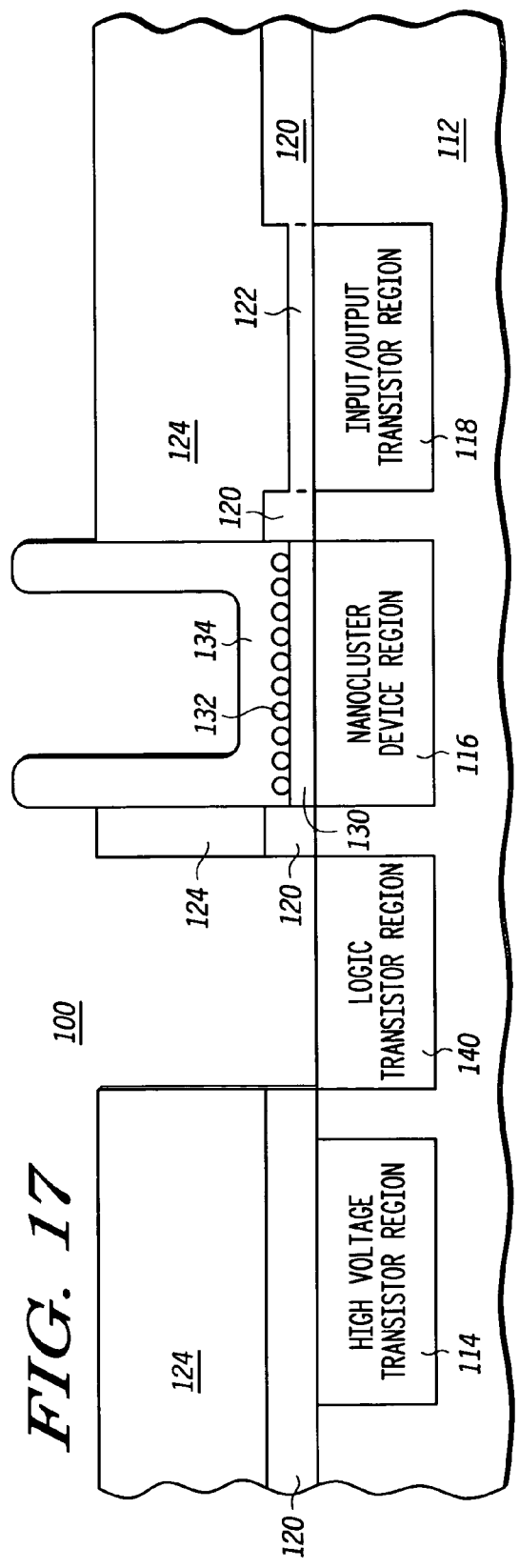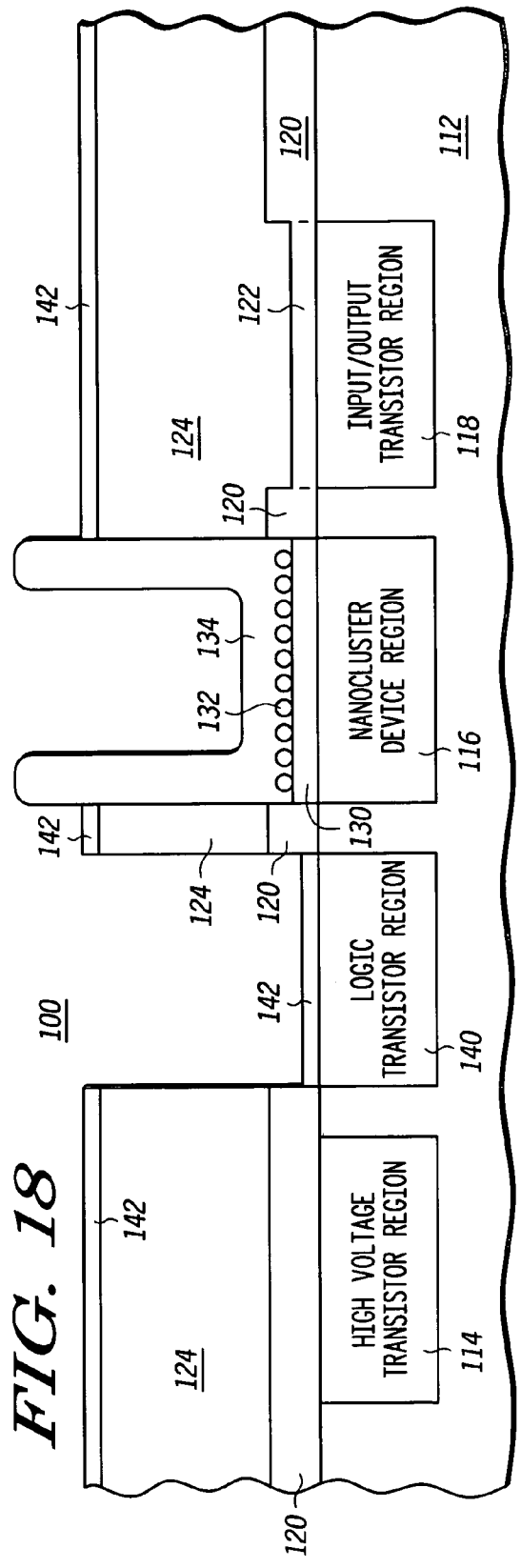

US 7,183,159 B2

METHOD OF FORMING AN INTEGRATED CIRCUIT HAVING NANOCLUSTER DEVICES AND NON-NANOCLUSTER DEVICES

CROSS REFERENCE TO RELATED APPLICATIONS

This application is related to the following pending applications:
(1) U.S. Ser. No. 10/876,805 (Robert F. Steimle) published as U.S. 2005-0287729A1 and entitled "Method of Forming a Nanocluster Charge Storage Device", filed Jun. 24, 2004 and assigned to the assignee hereof and
(2) U.S. Ser. No. 10/663,621 (Robert F. Steimle et al.), now U.S. Pat. No. 6,958,265 entitled "Semiconductor Device With Nanoclusters", filed Sep. 16, 2003 and assigned to the assignee hereof.

FIELD OF THE INVENTION

This invention relates generally to semiconductor devices, and more specifically, to making semiconductor devices having nanoclusters.

BACKGROUND OF THE INVENTION

Some devices such as memories (e.g. non volatile memories) utilize discrete charge storage elements called nanoclusters (e.g. of silicon, aluminum, gold, or germanium) for storing charge in a charge storage location of a transistor. In some examples, the nanoclusters are located between two dielectric layers, a bottom dielectric and a control dielectric. Examples of such transistors include thin film storage transistors. A memory typically includes an array of such transistors. Examples of nanocluster types include doped and undoped semiconductor nanoclusters such as silicon nanoclusters, germanium nanoclusters and their alloys. Other examples of nanocluster types include various conductive structures such as metal nanoclusters (e.g., gold nanoclusters and aluminum nanoclusters), and metal alloy nanoclusters. In some examples, nanoclusters are from 10–100 Angstroms in size.

Some memories that have charge storage transistors with nanoclusters are implemented on integrated circuits that also include high voltage transistors in the circuitry used for charging and discharging the charge storage locations of the charge storage transistors. Charging or discharging the charge storage locations is used to store one or more bits of information, and may be referred to as programming or erasing. These high voltage transistors typically include a relatively thick gate oxide. When nanocluster-based memories are integrated with transistors having thick gate oxide layers for handling relatively higher voltages and with transistors having thinner gate oxide layers, the severe oxidizing ambient used to make such transistors causes an undesirable increase in the nanocluster-based memory bottom dielectric thickness and also causes nanocluster oxidation. Any protection layer that is used to protect nanocluster-based memories may result in damage to the memories when the protection layer is removed. Accordingly, an improved method for making a device with nanoclusters is desirable.

BRIEF DESCRIPTION OF THE DRAWINGS

The present invention is illustrated by way of example and not limited to the accompanying figures, in which like references indicate similar elements.

FIGS. 1–10 illustrate in cross-sectional form a method for forming a semiconductor having a nanocluster device and a non-nanocluster device in accordance with one form of the present invention; and FIGS. 11–20 illustrate in cross-sectional form a method for forming a semiconductor having a nanocluster device and a non-nanocluster device in accordance with another form of the present invention.

Figure 3:
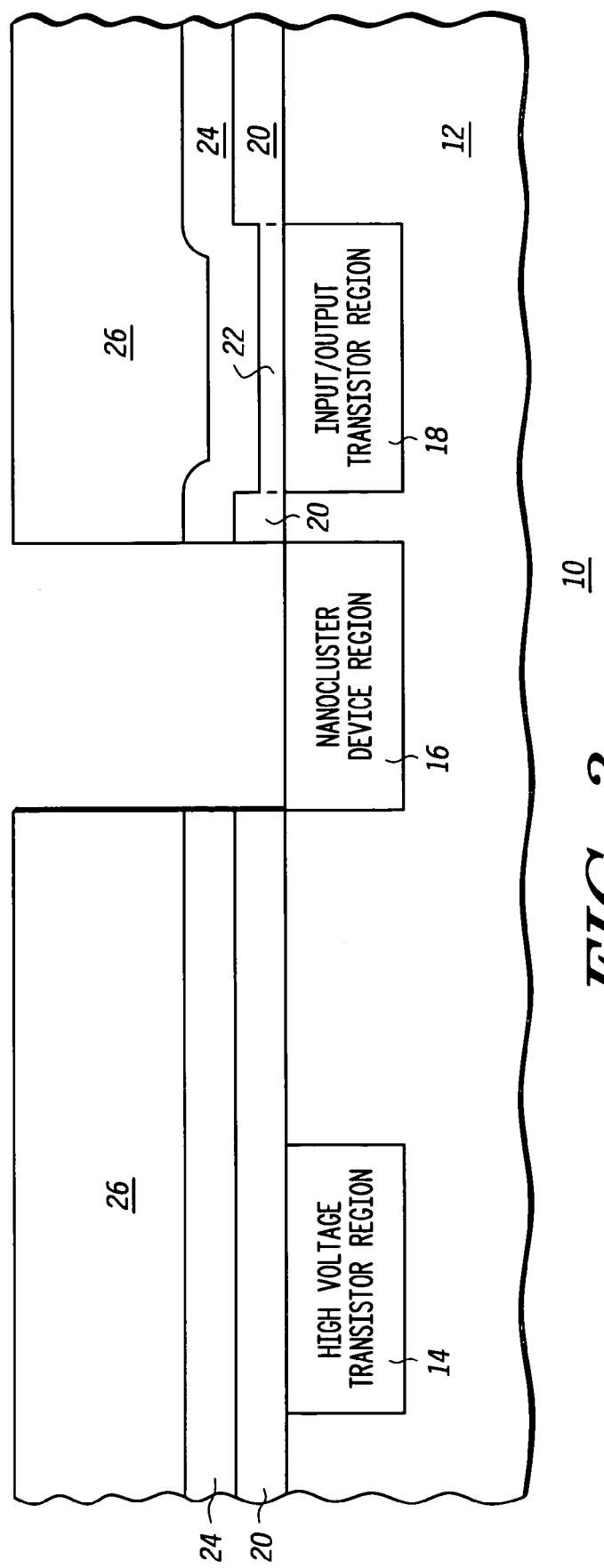

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Illustrated in FIG. 1 is an integrated circuit 10 having a substrate 12 that contains various regions with differing types of semiconductor devices. For example, within substrate 12 is a high voltage transistor region 14, a nanocluster device region 16 and an input/output (I/O) transistor region 18. A high voltage transistor, as used herein, is a transistor that is used to program and erase nanocluster charge storage devices or is a device that requires a high voltage (i.e. greater than six volts) operation. An I/O transistor, as used herein, is a transistor that is used to interface the electrical functions performed in the integrated circuit 10 with other components or circuitry (not shown) external to integrated circuit 10. Within each of high voltage transistor region 14, nanocluster device region 16 and the I/O transistor region 18 will be formed a plurality of semiconductor structures to be described below. For drawing simplicity, a single device is illustrated in each of the regions, but it should be well understood that multiple adjacent structures are implemented in each of the regions. Overlying the substrate 12 and each of the high voltage transistor region 14, nanocluster device region 16 and the I/O transistor region 18 is a first insulating layer 20. The first insulating layer 20 is etched by a mask (not shown) to form an opening over the I/O transistor region 18. In a subsequent step a second insulating layer 22 is grown overlying the I/O transistor region 18. In one form, each of the first insulating layer 20 and the second insulating layer 22 is an oxide such as silicon dioxide. Other types of insulating materials may however be used.

Illustrated in FIG. 2 is further processing of integrated circuit 10. In FIG. 2 a conformal sacrificial layer 24 is formed overlying first insulating layer 20 and second insulating layer 22. In one form the conformal sacrificial layer 24 is formed of either polysilicon or silicon nitride, SiN, and functions as an oxidation barrier. A notable feature of the material selected for the conformal sacrificial layer 24 is that conformal sacrificial layer 24 may be removed selective to the second insulating layer 22. Therefore, the conformal sacrificial layer 24 may be either a semiconductor or an insulator.

Illustrated in FIG. 3 is further processing of integrated circuit 10. In FIG. 3 a masking layer 26 is formed over integrated circuit 10. The conformal sacrificial layer 24 and first insulating layer 20 are removed from nanocluster device region 16. Conformal sacrificial layer 24 and first insulating layer 20 may be removed by a combination of conventional dry and wet etching.

Figure 4:
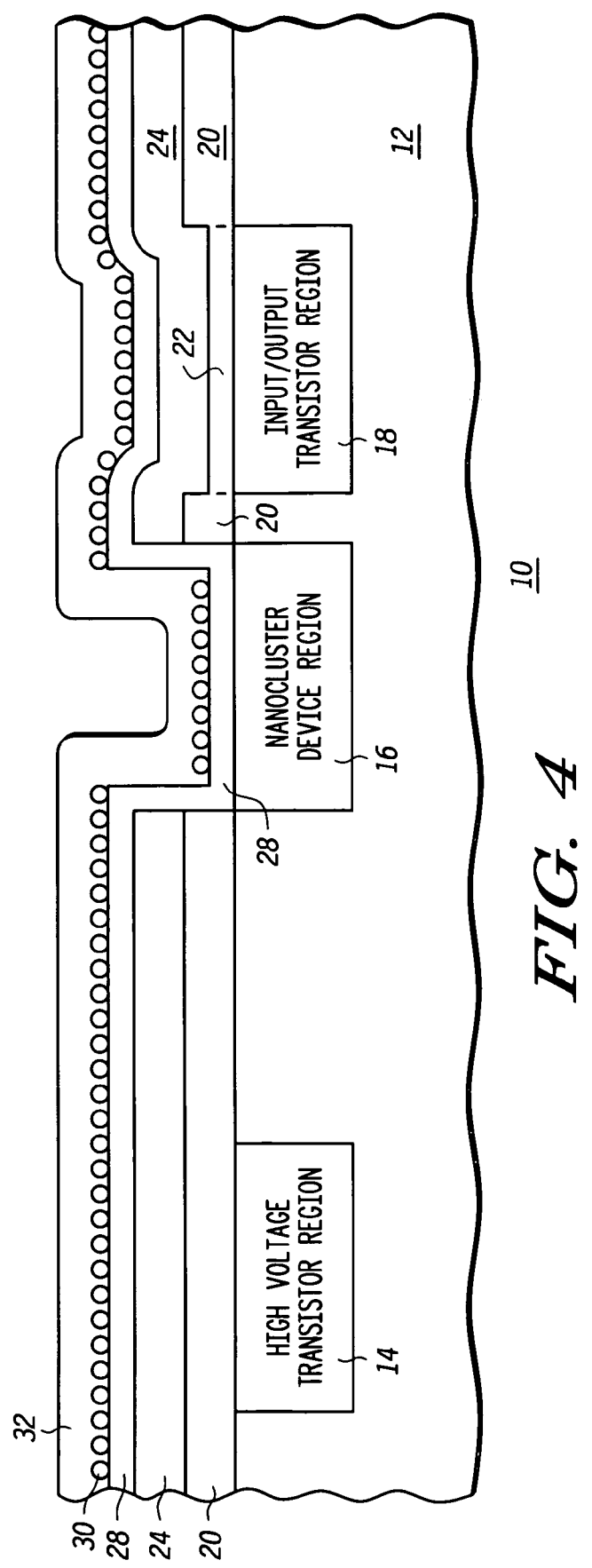

Illustrated in FIG. 4 is further processing of integrated circuit 10. In FIG. 4 a masking layer 26 is removed by either ashing or a photoresist strip using a conventional removal process. Subsequently, an insulating layer 28 is grown or deposited over nanocluster device region 116. Concomitantly, the insulating layer 28 is also formed over the sacrificial layer 24. Insulating layer 24 may be formed of silicon dioxide or any other suitable insulator. Nanoclusters are then formed over the entirety of the integrated circuit 10 to form a nanocluster layer 30. The nanoclusters may be formed by chemical vapor deposition (CVD) methods, aerosol application, or spin-on techniques, for example. The nanoclusters may be formed of silicon, germanium, silicongermanium alloys or other suitable materials. A conformal insulating layer 32 is formed over the nanocluster layer 30 and insulating layer 28. The insulating layer 32 may be silicon dioxide, silicon nitride or other suitable insulating material. In one form the conformal insulating layer 32 is deposited by CVD. The conformal insulating layer 32 may also be a laminated material composed of two or more individual layers. It should be noted that formation of nanoclusters storage devices after the formation of the insulating layers for transistors in the high voltage transistor region 14 and the I/O transistor region 18 is advantageous. The reason is insulating layer 32 is permeable to oxidation, and particularly the steam oxidation frequently used to grow the first insulating layer 20. As such, nanoclusters 30 may be oxidized if nanocluster devices are formed prior to the formation of the first insulating layer 20 for the high voltage transistor region 14. Likewise the process used to form insulating layer 22 for the I/O transistor region 18 may also degrade the nanocluster properties in a similar manner.

Figure 5:
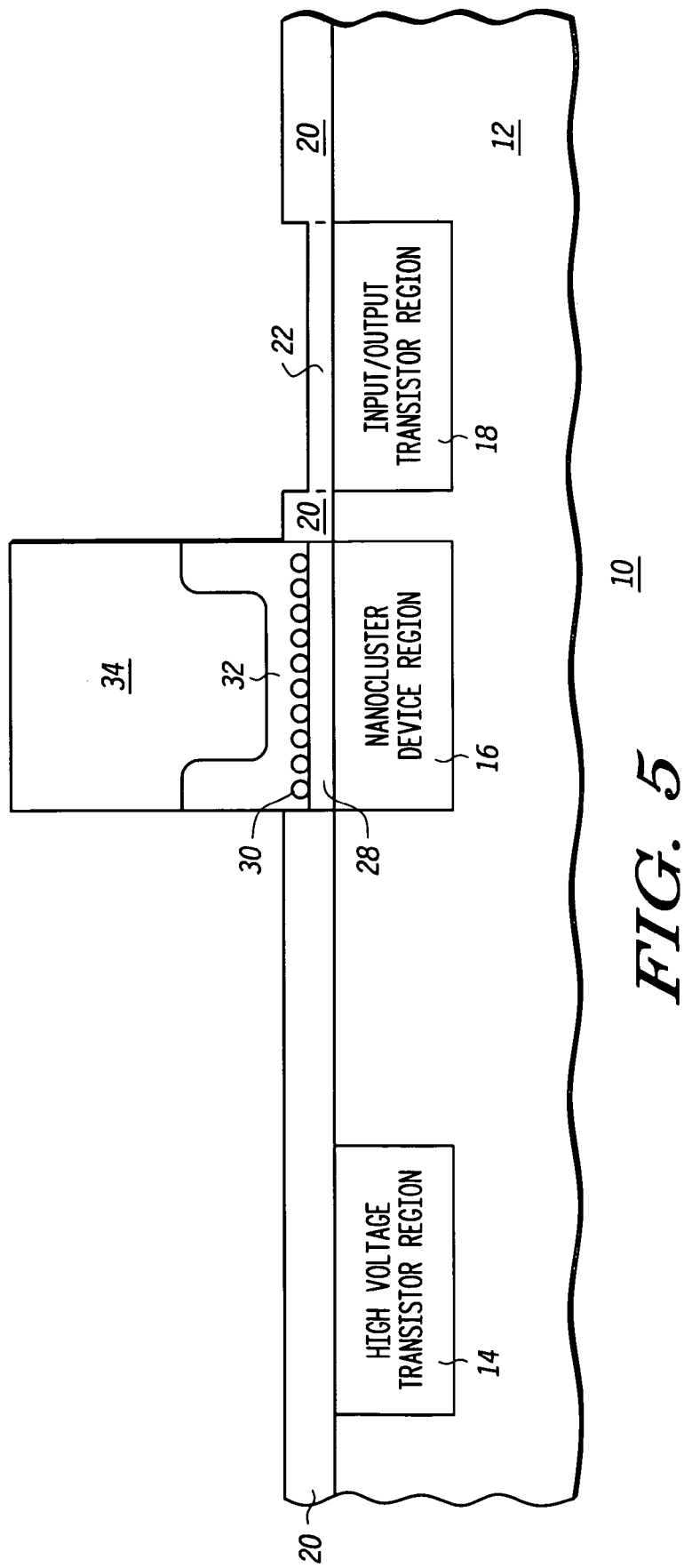

Illustrated in FIG. 5 is further processing of integrated circuit 10. In FIG. 5 a mask 34 is formed overlying the nanocluster device region 16. In one form, photoresist may be used as the material for mask 34. With the mask 34 in place, exposed portions of the conformal insulating layer 32, the nanocluster layer 30, the insulating layer 28 and the conformal sacrificial layer 24 are removed. Removal of the exposed portions of these layers is performed, in one form, by different wet etches or a combination of a wet etch and a dry etch. Substantially all of the first insulating layer 20 and the second insulating layer 22 remain intact. However, in some forms, a portion of the first insulating layer 20 and the second insulating layer 22 may be removed in the exposed regions of FIG. 5.

Figure 6:
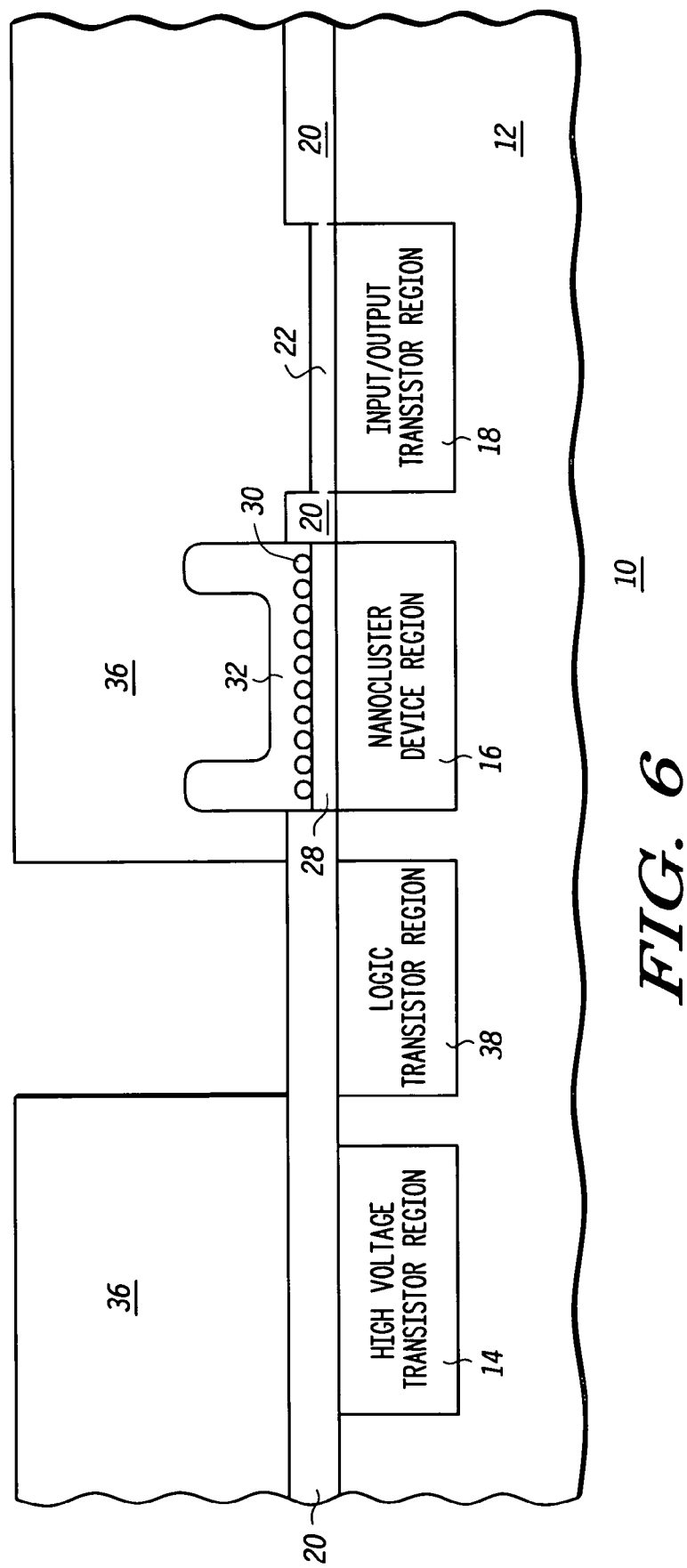

Illustrated in FIG. 6 is further processing of integrated circuit 10. In FIG. 6 the mask 34 is removed by either ashing or a photoresist strip using a conventional removal process. Mask 36 is formed overlying all portions of the integrated circuit 10 except overlying a defined area designated in FIG. 6 as a logic transistor region 38. As used herein, a logic transistor is a transistor that functions to perform fast electrical computation and switching functions. Such transistors may implement Boolean logic functions as well as amplification of circuit signals. Numerous other functions, such as a form of memory storage, may be implemented. In one form mask 36 is photoresist. Prior to the formation of mask 36 a conventional deposition of N conductivity and P conductivity diffusions (not shown) is made within the logic transistor region 38 using conventional masking steps (not shown).

Illustrated in FIG. 7 is further processing of integrated circuit 10 wherein with mask 36 in place, a wet etch is used to remove the first insulating layer 20 from above the logic transistor region 38. Mask 36 is then removed using conventional removal techniques.

Illustrated in FIG. 8 is further processing of integrated circuit 10 wherein an insulating layer 40 is grown overlying the logic transistor region 38. Insulating layer 40 will function as a gate insulating layer for transistors and other devices to be formed in the logic transistor region 38. In one form, the insulating layer 40 is an oxide such as silicon dioxide.

Figure 9:
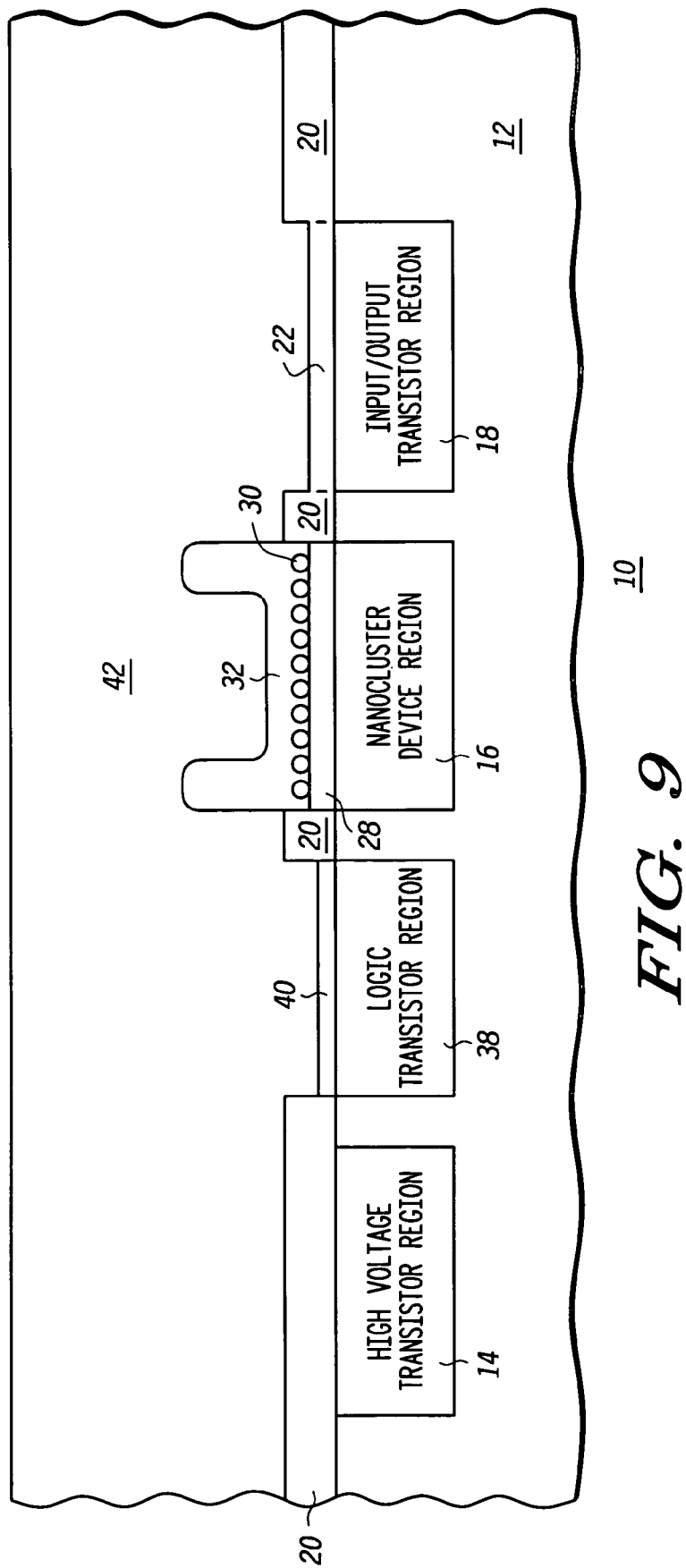

Illustrated in FIG. 9 is further processing of integrated circuit 10 wherein a conductive layer 42 is formed overlying the integrated circuit 10. This conductive layer 42 may be polysilicon or other suitable conductors such as tungsten silicide, tantalum nitride, titanium nitride, etc. The conductive layer 42 is deposited to a predetermined desired conformal depth.

Figure 10:
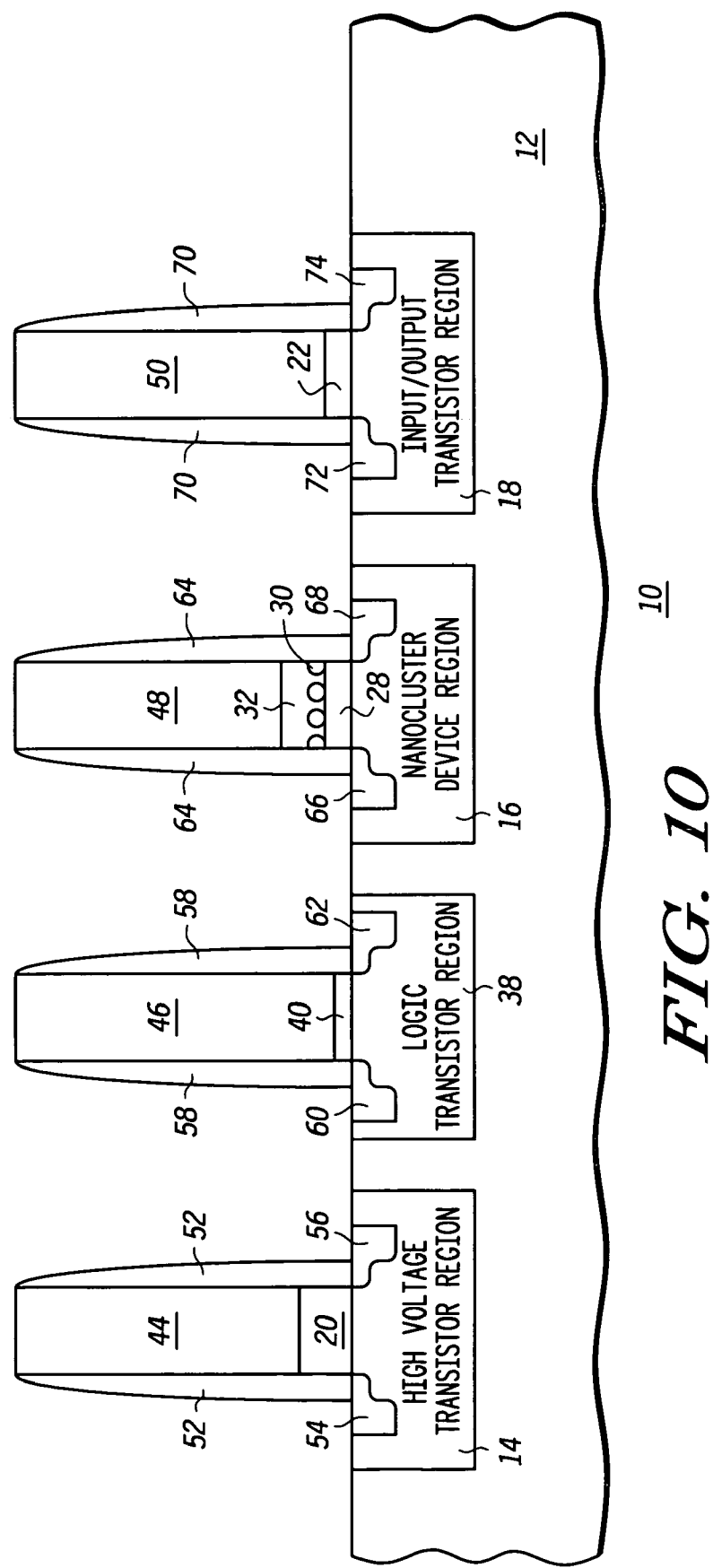

Illustrated in FIG. 10 is further processing of integrated circuit 10 wherein the conductive layer 42 is selectively etched to form a plurality of gates such as gate 44, gate 46, gate 48 and gate 50. Within each of high voltage transistor region 14, nanocluster device region 16, input/output transistor region 18 and logic transistor region 38 are formed a plurality of gates. For convenience of illustration, only one gate is illustrated in each of the high voltage transistor region 14, nanocluster device region 16, input/output transistor region 18 and logic transistor 38. Gate 44 has an associated sidewall spacer 52 formed by conventional methods with a source 54 and a drain 56 to form a functional transistor. Similarly, gate 46 has an associated sidewall spacer 58 with a source 60 and a drain 62. Gate 48 has an associated sidewall spacer 64 with a source 66 and a drain 68. Gate 50 has an associated sidewall spacer 70 with a source 72 and a drain 74. Therefore, there has been formed a plurality of transistors in each of a plurality of regions, wherein each region has a gate oxide of differing thickness. In one form, the high voltage transistor region 14 has transistors with relatively large gate oxide thicknesses. By way of example only, the gate oxide formed from first insulating layer 20 may have a thickness in the range of five to twenty nanometers and preferably in the range of eight to sixteen nanometers. Alternatively, an average of the gate oxide thicknesses within the high voltage transistor region 14 is substantially in the range of five to twenty nanometers. The I/O transistor region 18 has transistors having gate oxides that vary substantially within a range of about 2.6 to nine nanometers and preferably in the range of five to seven nanometers. Alternatively, an average of the gate oxide thicknesses within the I/O transistor region 18 is substantially in the range of five to seven nanometers. The nanocluster device region 16 has storage cells each having a transistor gate oxide thickness substantially in the range of 1.8 to ten nanometers and preferably in the range of four to seven nanometers. Alternatively, an average of the gate oxide thicknesses within the nanocluster device region 16 is substantially in the range of 1.8 to ten nanometers. In contrast, the logic transistor region 38 has transistor having much thinner gate oxide thicknesses. For example, the transistors within logic transistor region 38 have a thickness substantially in a range of about 0.8 to three nanometers and preferably in the range of about 1.2 to 2.6 nanometers. Alternatively, an average of the gate oxide thicknesses within the logic transistor region 38 is substantially in the range of about 1.2 to 2.6 nanometers. It should be noted that the formation of the transistors of the logic transistor region 38 occurs after the formation of the transistors of the nanocluster device region 16. In order to form nanocluster device region 16 processing temperatures that are relatively high are required and these temperatures would significantly alter the diffusion characteristics of the transistors within the logic transistor region 38 if those transistors were first formed. By deferring the formation of the logic transistors within logic transistor region 38 until after formation of the high voltage transistors and the nanocluster transistors, modification of the electrical parameters and characteristics of the logic transistors is minimized. It should be noted that the formation of the transistors within the nanocluster device region 16 does not significantly alter the electrical characteristics of the transistors in the high voltage transistor region 14 because the gate oxide thickness of the transistors in that region is great enough that the subsequent high processing temperatures do not alter the parameters as much as transistors having thinner gate oxides.

While the oxide thickness ranges provided for the I/O transistor region 18 and the logic transistor region 38 may theoretically permit the gate oxide within the logic transistor region 38 to be larger than the gate oxide in the I/O transistor region 18, the gate oxide thickness within logic transistor region 38 is not greater than the gate oxide thickness within I/O transistor region 18. For example, if the gate oxide thickness within I/O transistor region 18 is in the lowest portion of the illustrated range, the gate oxide thickness within logic transistor region 38 will also be in the lowest portion of the illustrated range.

It should be well understood that the formation of certain transistor features in each of the regions may be implemented concurrently. For example, the sidewall spacers, sources and drains for all of the devices illustrated in FIG. 10 may be implemented concurrently.

Illustrated in FIG. 11 is another form of a method for making an integrated circuit having nanocluster charge storage devices and non-nanocluster devices. An integrated circuit 100 has a substrate 112 that contains various regions with differing types of semiconductor devices. For example, within substrate 112 is a high voltage transistor region 114, a nanocluster device region 116 and an input/output (I/O) transistor region 118. Within each of high voltage transistor region 114, nanocluster device region 116 and the I/O transistor region 118 will be formed a plurality of semiconductor structures to be described below. Overlying the substrate 112 and each of the high voltage transistor region 114, nanocluster device region 116 and the I/O transistor region 118 is a first insulating layer 120. The first insulating layer 120 is etched by a mask (not shown) to form an opening over the I/O transistor region 118. In a subsequent step a second insulating layer 122 is grown overlying the I/O transistor region 118. In one form, each of the first insulating layer 120 and the second insulating layer 122 is an oxide such as silicon dioxide. Other types of insulating materials may however be used. The terms high voltage transistor and I/O transistor are used consistent with the explanations provided previously.

Illustrated in FIG. 12 is further processing of integrated circuit 100 wherein a conductive layer 124 is deposited overlying the first insulating layer 120 and the second insulating layer 122. In one form the conductive layer 124 is implemented with polysilicon. Other electrically conductive materials may be used. Overlying conductive layer 124 is a conformal sacrificial layer 126 that is deposited. In one form, the sacrificial layer 126 is a nitride. The sacrificial layer 126 functions as an oxidation barrier material. In one form the overlying conductive layer 124 has a thickness generally in a range from approximately twenty to forty nanometers. The sacrificial layer 126 in one form has a thickness generally in a range from approximately ten to twenty nanometers. Other thickness ranges may however be implemented.

Figure 13:
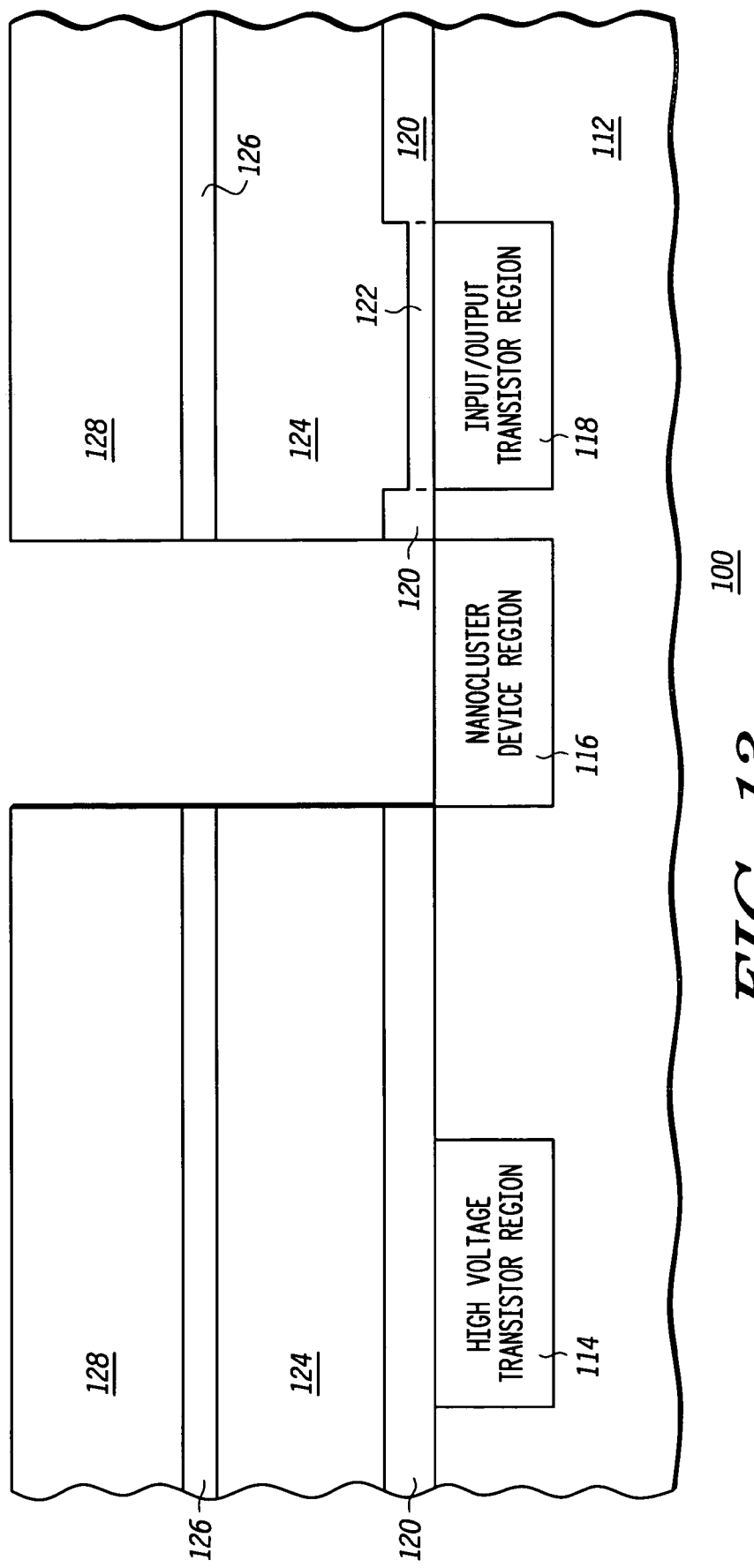

Illustrated in FIG. 13 is further processing of integrated circuit 100 wherein a mask 128 is formed with an opening over the nanocluster device region 116. With the opening in mask 128, the sacrificial layer 126, conductive layer 124 and first insulating layer 120 are etched and substantially removed from above the nanocluster device region 116. The etching involved in this portion of the method is conventional.

Figure 14:
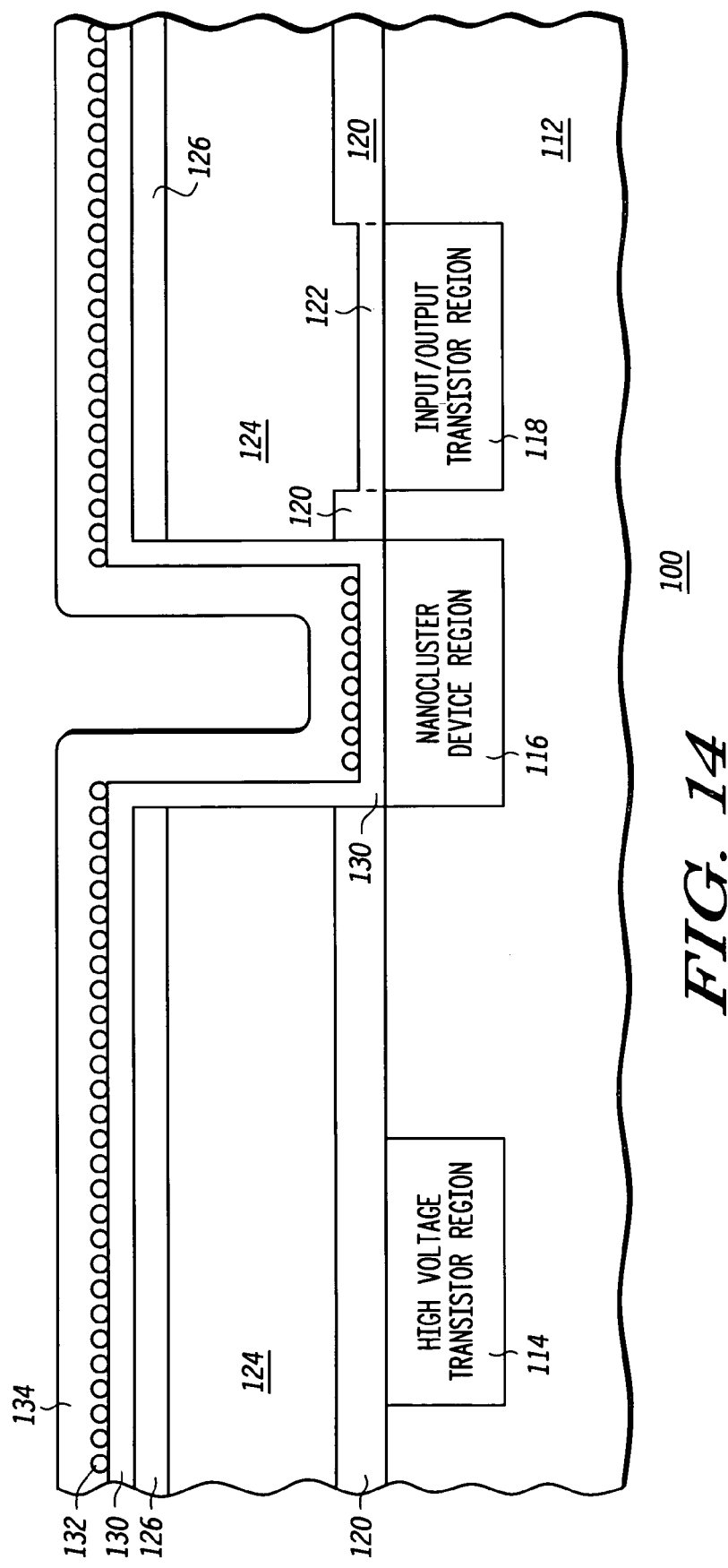

Illustrated in FIG. 14 is further processing of integrated circuit 100. In FIG. 14 the masking layer 128 is removed either by ashing or by a photoresist strip using a conventional removal process. Subsequently, an insulating layer 130 is grown or deposited over nanocluster device region 116. Concomitantly the insulating layer 130 is also formed over sacrificial layer 126. Insulating layer 130 may be formed of silicon dioxide or any other suitable insulator. Nanoclusters are then formed over the entirety of the integrated circuit 100 to form a nanocluster layer 132. The nanoclusters may be formed by chemical vapor deposition (CVD) methods, aerosol application, or spin-on techniques, for example. The nanoclusters may be formed of silicon, germanium, silicon-germanium alloys or other suitable materials. A conformal insulating layer 134 is formed over the nanocluster layer 132 and insulating layer 126. The insulating layer 134 may be silicon dioxide, silicon nitride or other suitable insulating material. In one form the conformal insulating layer 134 is deposited by CVD. The conformal insulating layer 134 may also be a laminated material composed of two or more individual layers. It should be noted that formation of nanoclusters storage devices after the formation of the insulating layers for transistors in the high voltage transistor region 114 and the I/O transistor region 118 is advantageous. The reason is insulating layer 134 is permeable to oxidation particularly the steam oxidation frequently used to grow high voltage insulating layer 120. As such, nanoclusters 132 may be oxidized if nanocluster devices are formed prior to the formation of the second insulating layer 120 for the high voltage transistor region 114. Likewise the process used to form insulating layer 122 for the I/O transistor region 118 may also degrade the nanocluster properties in a similar manner.

Figure 15:
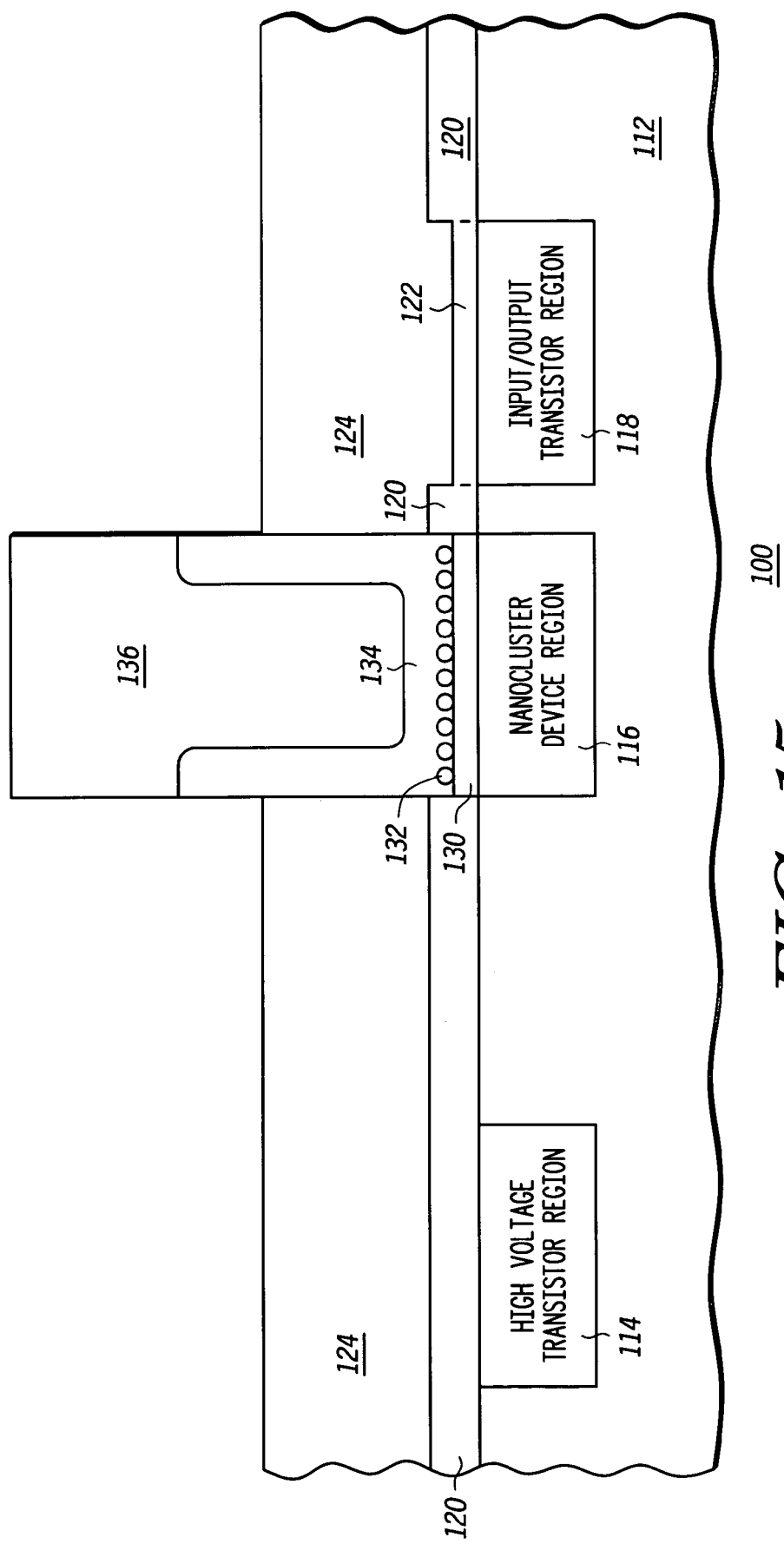

Illustrated in FIG. 15 is further processing of integrated circuit 100. In FIG. 5 a mask 136 is formed overlying the nanocluster device region 116. In one form, photoresist may be used as the material for mask 136. With the mask 136 in place, exposed portions of the conformal insulating layer 134, the nanocluster layer 132 and the insulating 126 are removed. Removal of the exposed portions of these layers is performed, in one form, by a wet etch or a combination of a wet etch and a dry etch. Substantially all of the conducting layer 124 remains intact.

Figure 16:
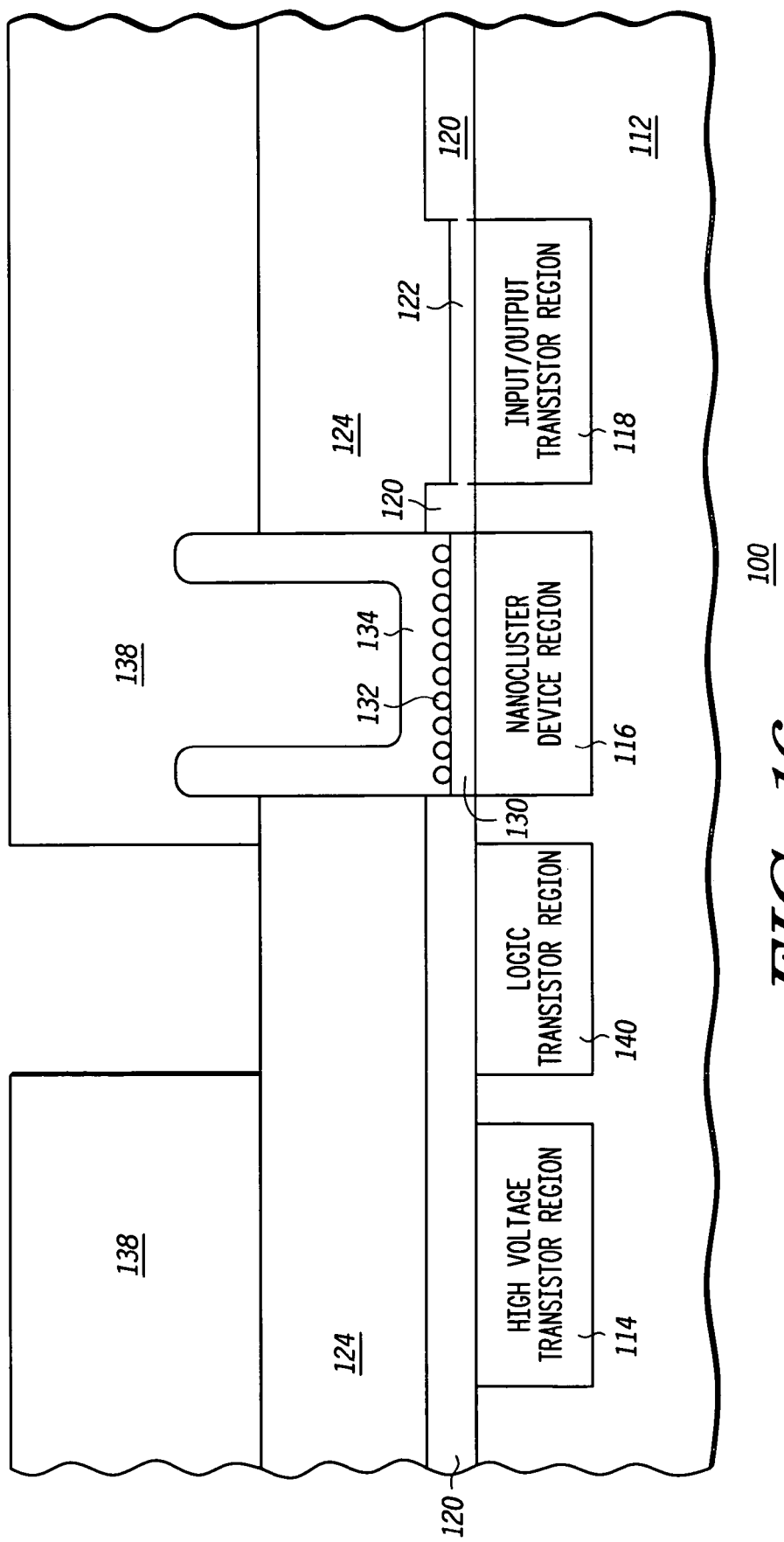

Illustrated in FIG. 16 is further processing of integrated circuit 100. In FIG. 16 the mask 136 is removed by either ashing or a photoresist strip using a conventional removal process. Mask 138 is formed overlying all portions of the integrated circuit 100 except overlying a defined area designated in FIG. 6 as a logic transistor region 140. As used herein, a logic transistor is a transistor that functions to perform fast electrical computation and switching functions. Such transistors may implement Boolean logic functions as well as amplification of circuit signals. Numerous other functions, such as a form of memory storage, may be implemented. In one form mask 138 is photoresist. Prior to the formation of mask 138 a conventional deposition of N conductivity and P conductivity diffusions (not shown) is made within the logic transistor region 140 using conventional masking steps (not shown).

Illustrated in FIG. 17 is further processing of integrated circuit 100 wherein with mask 138 in place, a combination of dry and wet etch is used to remove the conducting layer 124 and insulating layer 120 from above the logic transistor region 140. Mask 138 is then removed using conventional removal techniques.

Illustrated in FIG. 18 is further processing of integrated circuit 100 wherein an insulating layer 142 is grown overlying the logic transistor region 140. Additionally, the insulating layer 142 is likely to grow over conducting layer 124 depending upon the material composition of conducting layer 124. Insulating layer 142 will function as a gate insulating layer for transistors and other devices to be formed in the logic transistor region 140. In one form, the insulating layer 142 is an oxide such as silicon dioxide. Other materials may be used for insulating layer 142 such as high k dielectrics which include hafnium oxide, zirconium oxide, etc. Depending upon the material composition for insulating layer 142, the insulating layer 142 may be deposited.

Figure 19:
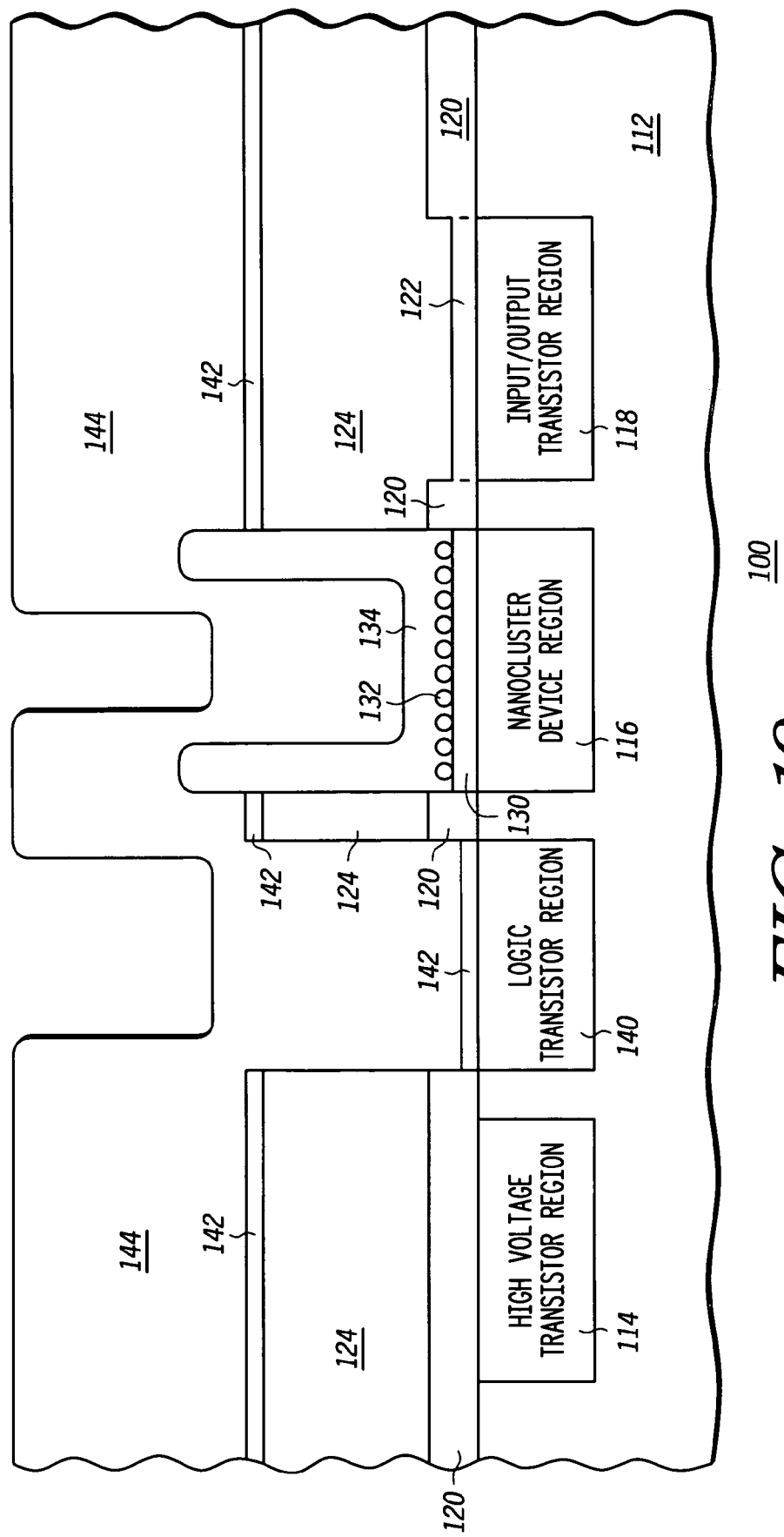

Illustrated in FIG. 19 is further processing of integrated circuit 100 wherein a conductive layer 144 is formed overlying the integrated circuit 100. This conductive layer 144 may be polysilicon or other suitable conductors such as tungsten silicide, tantalum nitride, titanium nitride, etc. The conductive layer 144 is deposited to a predetermined desired conformal depth.

Figure 20:
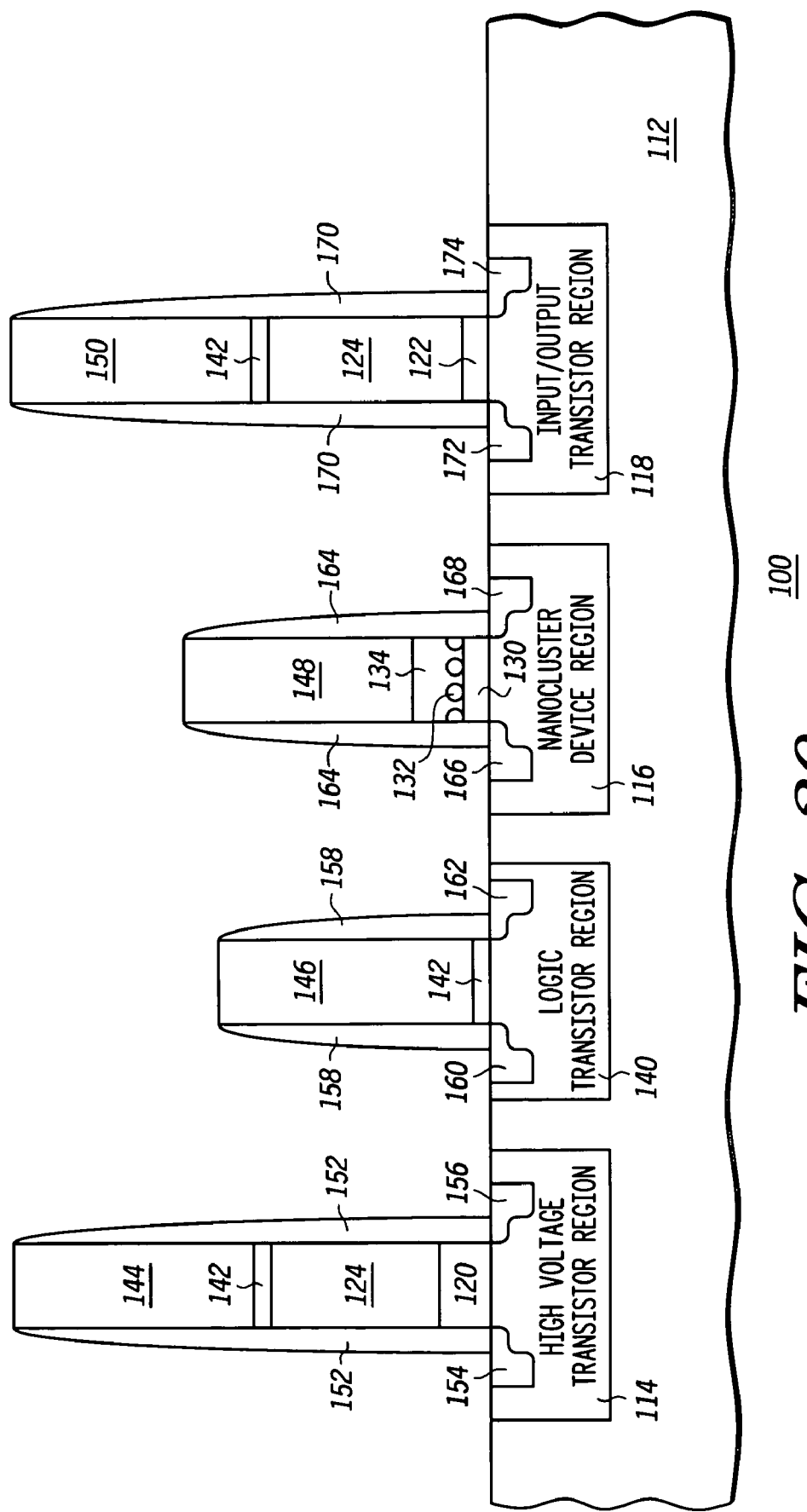

Illustrated in FIG. 20 is further processing of integrated circuit 100 wherein the conductive layer 144 is selectively etched to form a plurality of gates such as gate 144, gate 146, gate 148 and gate 150. Note that since transistors in the high voltage transistor region 114 and transistors in the I/O transistor region 118 have a different total gate conductor thickness than transistors in regions 116 and 140, the gates in regions 114 and 118 may need to be etched separately from the gates in regions 116 and 140. If conductive layer 124 in the gates of region 118 is thin, then the gate etch may be accomplished with one masking step. Also, it should be noted that for transistors in each of regions 114 and 118, the insulating layer 142 is relatively thin. Therefore, the two separated conductive gate areas do not need to be electrically connected together to function as a single gate electrode.

Within each of the regions 114, 116, 118 and 140 are formed a plurality of gates. For convenience of illustration, only one gate is illustrated in each of the regions 114, 116, 118 and 140. Gate 144 has an associated sidewall spacer 152 formed by conventional methods with a source 154 and a drain 156 to form a functional transistor. Similarly, gate 146 has an associated sidewall spacer 158 with a source 160 and a drain 162. Gate 148 has an associated sidewall spacer 164 with a source 166 and a drain 168. Gate 150 has an associated sidewall spacer 170 with a source 172 and a drain 174. Therefore, there has been formed a plurality of transistors in each of a plurality of regions, wherein each region has a gate oxide of differing thickness. In one form, the high voltage transistor region 114 has transistors with relatively large gate oxide thicknesses. By way of example only, gate oxide 120 may have a thickness in the range of five to twenty nanometers and preferably in the range of eight to sixteen nanometers. Alternatively, an average of the gate oxide thicknesses within the high voltage transistor region 114 is substantially in the range of five to twenty nanometers. The I/O transistor region 118 has transistors having gate oxides that vary substantially within a range of about 2.6 to nine nanometers and preferably in the range of five to seven nanometers. Alternatively, an average of the gate oxide thicknesses within the I/O transistor region 118 is substantially in the range of five to seven nanometers. The nanocluster device region 116 has storage cells each having a transistor gate oxide thickness substantially in the range of 1.8 to ten nanometers and preferably in the range of four to seven nanometers. Alternatively, an average of the gate oxide thicknesses within the nanocluster device region 116 is substantially in the range of 1.8 to ten nanometers. In contrast, the logic transistor region 140 has transistor having much thinner gate oxide thicknesses. For example, the transistors within logic transistor region 140 have a thickness substantially in a range of about 0.8 to three nanometers and preferably in the range of about 1.2 to 2.6 nanometers. Alternatively, an average of the gate oxide thicknesses within the logic transistor region 140 is substantially in the range of about 1.2 to 2.6 nanometers. It should be noted that the formation of the transistors of the logic transistor region 140 occurs after the formation of the transistors of the nanocluster device region 116. In order to form nanocluster device region 116 processing temperatures that are relatively high are required and these temperatures would significantly alter the diffusion characteristics of the transistors within the logic transistor region 140 if those transistors were first formed. By deferring the formation of the logic transistors within logic transistor region 140 until after formation of the high voltage transistors and the nanocluster transistors, modification of the electrical parameters and characteristics of the logic transistors is minimized. It should be noted that the formation of the transistors within the nanocluster device region 116 does not significantly alter the electrical characteristics of the transistors in the high voltage transistor region 114 because the gate oxide thickness of the transistors in that region is great enough that the subsequent high processing temperatures do not alter the parameters as much as transistors having thinner gate oxides.

While the oxide thickness ranges provided for the I/O transistor region 118 and the logic transistor region 140 may theoretically permit the gate oxide within the logic transistor region 140 to be larger than the gate oxide in the I/O transistor region 118, the gate oxide thickness within logic transistor region 140 is not greater than the gate oxide thickness within I/O transistor region 118. For example, if the gate oxide thickness within I/O transistor region 118 is in the lowest portion of the illustrated range, the gate oxide thickness within logic transistor region 140 will also be in the lowest portion of the illustrated range.

By now it should be appreciated that there has been provided methods for integrating nanocluster storage devices with transistors having thicker and thinner gate oxides. This integration prevents oxidation of nanoclusters and nonvolatile memory tunnel oxide thickness increase during gate oxide formation of transistors in a high voltage transistor region. The method described herein also ensures that transistor gate oxides of logic transistors, which are typically thinner than transistor gate oxides of other functional types of transistors, are not exposed to additional heat. The methods described herein do not require a separate dedicated sacrificial layer for the removal of nanoclusters.

In the foregoing specification, the invention has been described with reference to specific embodiments. However, one of ordinary skill in the art appreciates that various modifications and changes can be made without departing from the scope of the present invention as set forth in the claims below. For example, the devices that may be formed in the nanocluster device region 116 may be memory storage devices such as a nonvolatile memory, one time programmable (OTP) memories, dynamic random access memories or may be optical emitting devices. Various metals may be used to implement conductive layers. Various metal oxide materials may be used as insulating materials that function as gate dielectrics. The methods described herein may be applied in the formation of a FINFET transistor including FINFETs that function as a memory storage device. Various types and sizes of nanoclusters may be used and various techniques may be used to deposit the nanoclusters. For example, in one form, the nanoclusters are silicon and have a diameter substantially in a range of one to ten nanometers. Accordingly, the specification and figures are to be regarded in an illustrative rather than a restrictive sense, and all such modifications are intended to be included within the scope of the present invention.

In one form there is provided a method of forming an integrated circuit. A first region of the integrated circuit is identified for locating a first transistor. A second region of the integrated circuit is identified for locating nanoclusters. A third region of the integrated circuit is identified for locating a second transistor. A gate insulator of the first transistor is formed in the first region of the integrated circuit. Subsequent to forming the gate insulator of the first transistor, nanoclusters are formed in the second region of the integrated circuit. Subsequent to forming the nanoclusters in the second region of the integrated circuit, a gate insulator of the second transistor is formed in the third region of the integrated circuit. The gate insulator of the second transistor is substantially thinner than the gate insulator of the first transistor. Formation of the first transistor and the second transistor is then completed. In one form the gate insulator of the first transistor comprises a first oxide layer and the gate insulator of the second transistor comprises a second oxide layer formed separately from the first oxide layer. In another form the first oxide and the second oxide comprise a same oxide material. In one form a thickness of the gate insulator of the second transistor is less than or equal to three nanometers. In another form a thickness of the gate insulator of the first transistor is at least five nanometers. In another form the first transistor comprises a high voltage transistor that uses an operational voltage of six volts or greater. In another form the first transistor comprises an input/output transistor for interfacing electrical functions performed in the integrated circuit with circuitry external to the integrated circuit. In yet another form the second transistor comprises a logic transistor for functioning to perform fast electrical computation and switching functions. In another form the nanoclusters in the second region of the integrated circuit are used to form a plurality of non-volatile memory cells.

There is also provided a method of forming an integrated circuit by providing a substrate and identifying a first region overlying the substrate for locating a first plurality of transistors. A second region overlying the substrate is identified for locating a second plurality of transistors. A third region overlying the substrate is identified for locating a third plurality of transistors. A plurality of gate insulators of the first plurality of transistors is formed in the first region of the integrated circuit, the first plurality of gate insulators having a first average gate insulator thickness. Subsequent to forming the plurality of gate insulators of the first plurality of transistors, a plurality of gate insulators of the second plurality of transistors is formed and a layer of nanoclusters overlying the plurality of gate insulators of the second plurality of transistors is formed. The plurality of gate insulators of the second plurality of transistors have a second average gate insulator thickness. Subsequent to forming the layer of nanoclusters, a plurality of gate insulators of the third plurality of transistors is formed in the third region of the integrated circuit. This plurality of gate insulators has a third average gate insulator thickness. The third average gate insulator thickness is substantially less than the first average gate insulator thickness. Formation of the first plurality of transistors, second plurality of transistors and third plurality of transistors is completed. In one form the first plurality of gate insulators comprises oxide and is formed from a first insulating layer. The third plurality of gate insulators comprises oxide and is formed from a second insulating layer formed after the first insulating layer. In one form the oxide is silicon dioxide. In another form the third average gate insulator thickness is less than or equal to three nanometers. In yet another form the first average gate insulator thickness is at least five nanometers. In another form the first plurality of transistors comprises a plurality of high voltage transistors that use an operational voltage of six volts or greater. In yet another form the first plurality of transistors comprises a plurality of input/output transistors for interfacing electrical functions performed in the integrated circuit with circuitry external to the integrated circuit. In yet another form the third plurality of transistors comprises a plurality of logic transistors for functioning to perform fast electrical computation and switching functions. In yet another form the nanoclusters in the second region of the integrated circuit are used to form a plurality of non-volatile memory cells.

There is also provided a method of forming an integrated circuit by identifying a first region of the integrated circuit for locating a first transistor. A second region of the integrated circuit is identified for locating a second transistor. A third region of the integrated circuit is identified for locating nanoclusters. A fourth region of the integrated circuit is identified for locating a third transistor. A gate dielectric of the first transistor is formed in the first region of the integrated circuit and a gate dielectric of the second transistor is formed in the second region of the integrated circuit. Subsequent to forming the gate dielectric of the first transistor and forming the gate dielectric of the second transistor, nanoclusters are formed in the third region of the integrated circuit. Subsequent to forming nanoclusters in the third region of the integrated circuit, a gate dielectric of the third transistor is formed in the fourth region of the integrated circuit. The gate dielectric of the third transistor is substantially thinner than each of the gate dielectric of the first transistor and the gate dielectric of the second transistor. In one form the first transistor comprises a high voltage transistor and the gate dielectric of the first transistor has a thickness within a range of substantially five to twenty nanometers. In another form the second transistor comprises an input/output transistor and the gate dielectric of the second transistor has a thickness within a range of substantially 2.6 to nine nanometers. In yet another form the fourth transistor comprises a logic transistor and the gate dielectric of the third transistor has a thickness within a range of substantially 0.8 to three nanometers.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

What is claimed is:

1. A method of forming an integrated circuit, comprising:
providing a substrate;
identifying a first region overlying the substrate for locating a first plurality of transistors;
identifying a second region overlying the substrate for locating a second plurality of transistors;
identifying a third region overlying the substrate for locating a third plurality of transistors;
forming a plurality of gate insulators of the first plurality of transistors in the first region of the integrated circuit, the plurality of gate insulators of the first plurality of transistors having a first average gate insulator thickness;
subsequent to forming the plurality of gate insulators of the first plurality of transistors, forming a plurality of gate insulators of the second plurality of transistors and forming a layer of nanoclusters overlying the plurality of gate insulators of the second plurality of transistors, the plurality of gate insulators of the second plurality of transistors having a second average gate insulator thickness;
subsequent to forming the layer of nanoclusters, forming in the third region of the integrated circuit a plurality of gate insulators of the third plurality of transistors having a third average gate insulator thickness, wherein the third average gate insulator thickness is substantially less than the first average gate insulator thickness; and
completing formation of the first plurality of transistors, the second plurality of transistors and the third plurality of transistors.

2. The method of claim 1, wherein the plurality of gate insulators of the first plurality of transistors comprises oxide and is formed from a first insulating layer and wherein the plurality of gate insulators of the third plurality of transistors comprises oxide and is formed from a second insulating layer formed after the first insulating layer.

3. The method of claim 2, wherein the oxide comprises silicon dioxide.

4. The method of claim 1, wherein the third average gate insulator thickness is less than or equal to three nanometers.

5. The method of claim 1, wherein the first average gate insulator thickness is at least five nanometers.

6. The method of claim 1, wherein the first plurality of transistors comprises a plurality of high voltage transistors that use an operational voltage of six volts or greater.

7. The method of claim 1, wherein the first plurality of transistors comprises a plurality of input/output transistors for interfacing electrical functions performed in the integrated circuit with circuitry external to the integrated circuit.

8. The method of claim 1, wherein the third plurality of transistors comprises a plurality of logic transistors for functioning to perform fast electrical computation and switching functions.

9. The method of claim 1, further comprising:
using the nanoclusters in the second region of the integrated circuit to form a plurality of non-volatile memory cells.

10. A method of forming an integrated circuit, comprising:
providing a substrate;
identifying a first region overlying the substrate for locating a first plurality of transistors;
identifying a second region overlying the substrate for locating a second plurality of transistors, the second plurality of transistors comprising a layer of nanoclusters;
identifying a third region overlying the substrate that is separate from each of the first region and the second region for locating a third plurality of transistors;
forming a plurality of gate insulators of the first plurality of transistors in the first region of the integrated circuit, the plurality of gate insulators of the first plurality of transistors having a first average gate insulator thickness;
subsequent to forming the plurality of gate insulators of the first plurality of transistors, forming a plurality of gate insulators of the second plurality of transistors in the second region and forming the layer of nanoclusters overlying the plurality of gate insulators of the second plurality of transistors, the plurality of gate insulators of the second plurality of transistors having a second average gate insulator thickness;
subsequent to forming the layer of nanoclusters, forming in the third region of the integrated circuit a plurality of gate insulators of a third plurality of transistors having a third average gate insulator thickness,
wherein the third average gate insulator thickness and the second average gate insulator thickness are each less than the first average gate insulator thickness, the first average gate insulator thickness being substantially in a range of five to twenty nanometers, the second average gate insulator thickness being substantially within a range of 1.8 to ten nanometers and the third average gate insulator thickness being substantially within a range of 0.8 to three nanometers; and
completing formation of the first plurality of transistors, the second plurality of transistors and the third plurality of transistors.

11. The method of claim 10 wherein the first plurality of transistors comprises a plurality of high voltage transistors that use an operational voltage of six volts or greater.

12. The method of claim 10 wherein the first plurality of transistors comprises a plurality of input/output transistors for interfacing electrical functions performed in the integrated circuit with circuitry external to the integrated circuit.

13. The method of claim 10 wherein the third plurality of transistors comprises a plurality of logic transistors for functioning to perform fast electrical computation and switching functions.

14. The method of claim 10 further comprising:
using the nanoclusters in the second region of the integrated circuit to form a plurality of non-volatile memory cells.

15. A method of forming an integrated circuit, comprising:
providing a substrate;
identifying a high voltage transistor region overlying the substrate for locating a first plurality of transistors;
identifying a nanocluster device region overlying the substrate for locating a second plurality of transistors;
identifying an input/output transistor region overlying the substrate for locating a third plurality of transistors;
forming a plurality of gate insulators of the first plurality of transistors in the high voltage transistor region of the integrated circuit, the plurality of gate insulators of the first plurality of transistors having a first average gate insulator thickness;

subsequent to forming the plurality of gate insulators of the first plurality of transistors, forming a plurality of gate insulators of the second plurality of transistors and forming a layer of nanoclusters overlying the plurality of gate insulators of the second plurality of transistors, the plurality of gate insulators of the second plurality of transistors having a second average gate insulator thickness;

subsequent to forming the layer of nanoclusters, forming in the input/output transistor region of the integrated circuit a plurality of gate insulators of the third plurality of transistors having a third average gate insulator thickness, wherein the third average gate insulator thickness is substantially less than the first average gate insulator thickness and said third average gate insulator thickness is substantially equal to the second average gate insulator thickness; and completing formation of the first plurality of transistors, the second plurality of transistors and the third plurality of transistors.

16. The method of claim 15 wherein the first plurality of transistors comprises a plurality of high voltage transistors that use an operational voltage of six volts or greater.

17. The method of claim 15 wherein the first plurality of transistors comprises a plurality of input/output transistors for interfacing electrical functions performed in the integrated circuit with circuitry external to the integrated circuit.

18. The method of claim 15 wherein the third plurality of transistors comprises a plurality of logic transistors for functioning to perform fast electrical computation and switching functions.

19. The method of claim 15 further comprising:

using the nanoclusters in the second region of the integrated circuit to form a plurality of non-volatile memory cells.

* * * * *